(12) United States Patent
Wolf et al.

(10) Patent No.: US 11,184,729 B2
(45) Date of Patent: Nov. 23, 2021

(54) SYNCHRONIZATION OF MULTIPLE AUDIO PROCESSING CHAINS

(71) Applicant: Knowles Electronics, LLC, Itasca, IL (US)

(72) Inventors: Christopher Konrad Wolf, San Jose, CA (US); Erick Alvarado, San Jose, CA (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/888,596

(22) Filed: May 29, 2020

(65) Prior Publication Data

US 2020/0382891 A1 Dec. 3, 2020

Related U.S. Application Data

(60) Provisional application No. 62/855,423, filed on May 31, 2019.

(51) Int. Cl.
| | |
|---|---|
| *H04S 7/00* | (2006.01) |
| *H03L 7/00* | (2006.01) |
| *H04S 3/00* | (2006.01) |
| *H03K 21/38* | (2006.01) |

(52) U.S. Cl.
CPC ............... *H04S 7/30* (2013.01); *H03L 7/00* (2013.01); *H04S 3/008* (2013.01); *H03K 21/38* (2013.01); *H04S 2400/01* (2013.01)

(58) Field of Classification Search
None
See application file for complete search history.

(56) References Cited

U.S. PATENT DOCUMENTS

| | | | |
|---|---|---|---|
| 6,173,022 B1 * | 1/2001 | McPherson | G11B 20/00992 360/26 |
| 7,149,312 B1 * | 12/2006 | Wildhagen | H04H 40/45 381/2 |
| 7,474,722 B1 * | 1/2009 | Chieng | H03F 3/217 375/355 |
| 7,826,578 B1 * | 11/2010 | Melanson | G06F 1/12 375/354 |

(Continued)

*Primary Examiner* — Qin Zhu
(74) *Attorney, Agent, or Firm* — Loppnow & Chapa; Matthew C. Loppnow; Roland K. Bowler, II

(57) ABSTRACT

Disclosed herein are related to a system and a method for synchronizing signal processing on audio channels. In one aspect, a system includes processors, each including an audio data input configured to receive audio data from multiple audio sources. In one aspect, each processor includes audio channels coupled to the audio data input, where each audio channel includes a corresponding processing chain configured to convert a sample rate of audio data from a corresponding audio source. Each processor may include a synchronization pulse generator configured to generate a corresponding synchronization pulse for each processing chain in response to a trigger pulse. The synchronization pulse generator may include a counter configured to generate an output having a phase based on a programmable initial condition of the counter, where the synchronization pulse for each processing chain is based on the counter output and a phase register value of the corresponding processing chain.

24 Claims, 7 Drawing Sheets

(56) References Cited

U.S. PATENT DOCUMENTS

| | | | | |
|---|---|---|---|---|
| 2002/0190880 A1* | 12/2002 | McLaughlin | ...... | H03H 17/0628 |
| | | | | 341/61 |
| 2004/0186602 A1* | 9/2004 | Andersen | .............. | H03F 3/2175 |
| | | | | 700/94 |
| 2007/0046507 A1* | 3/2007 | Hirano | ............... | H03H 17/0621 |
| | | | | 341/61 |
| 2007/0110203 A1* | 5/2007 | Mizutani | ............ | H03H 17/0621 |
| | | | | 375/355 |
| 2009/0143884 A1* | 6/2009 | Chieng | .............. | H03H 17/0642 |
| | | | | 700/94 |
| 2012/0033771 A1* | 2/2012 | Wei | ....................... | H04L 25/068 |
| | | | | 375/355 |
| 2017/0270962 A1* | 9/2017 | Zeng | .................... | G11B 27/323 |
| 2017/0277507 A1* | 9/2017 | Ando | ..................... | H04R 27/00 |
| 2017/0289231 A1* | 10/2017 | Powell | ................. | H04L 65/601 |

\* cited by examiner

SYNCHRONIZATION OF MULTIPLE AUDIO PROCESSING CHAINS

TECHNICAL FIELD

The present disclosure relates generally to audio signal processing and more particularly to synchronization of multi-core audio signal processors and methods therein.

BACKGROUND

Audio signal processing on multiple channels delivers various advantages. In one example, beamforming may be performed on audio signals captured through a bank of microphones, such that sound from a particular direction can be captured and electronically processed. Despite the advantages of performing audio signal processing on multiple channels, synchronizing the audio signal processing on multiple channels remains challenging, for example, due to timing mismatch or phase errors of pulses to initiate the audio signal processing. Inaccuracy in the synchronization of processing signals from multiple channels may degrade performance.

DETAILED DESCRIPTION

Various embodiments disclosed herein are related to a system and a method for synchronizing signal processing performed on multiple audio channels. In one aspect, a system includes processors, each including an audio data input configured to receive audio data from multiple audio sources. In one aspect, each processor includes audio channels coupled to the audio data input, where each audio channel includes a corresponding processing chain configured to convert a sample rate of audio data from a corresponding audio source. Each processor may include a synchronization pulse generator configured to generate a corresponding synchronization pulse for each of the processing chains in response to a trigger pulse. The synchronization pulse generator may include a counter configured to generate an output having a phase based on a programmable initial condition of the counter, where the synchronization pulse for each processing chain is based on the counter output and a phase register value of the corresponding processing chain. Each processor may include a conditioning circuit configured to generate the trigger pulse in response to an arbitrarily selected external synchronization signal applied to each of the audio processors.

Advantageously, signal processing of multiple channels can be performed in a synchronous manner. In one aspect, a synchronization pulse generator generates pulses having same, overlapping, or different phases, synchronous to a clock signal, in response to a trigger pulse. The pulses are applied to corresponding processing chains for performing signal processing on multiple channels. Because different pulses are generated with coherent phases synchronous to a clock signal in response to a trigger pulse, performance of a signal processing such as beamforming, virtual button, other audio signal processing can be improved.

In one aspect, programmable initial condition and phase register values allow flexibility in generating synchronization pulses. For example, initial condition or phase register values can be determined to arbitrarily set phases or timings of synchronization pulses with respect to the trigger pulse. For another example, initial condition or phase register values can be adjusted to account for delays, chip-to-chip variations, or voltage and temperature variations.

Figure 1:
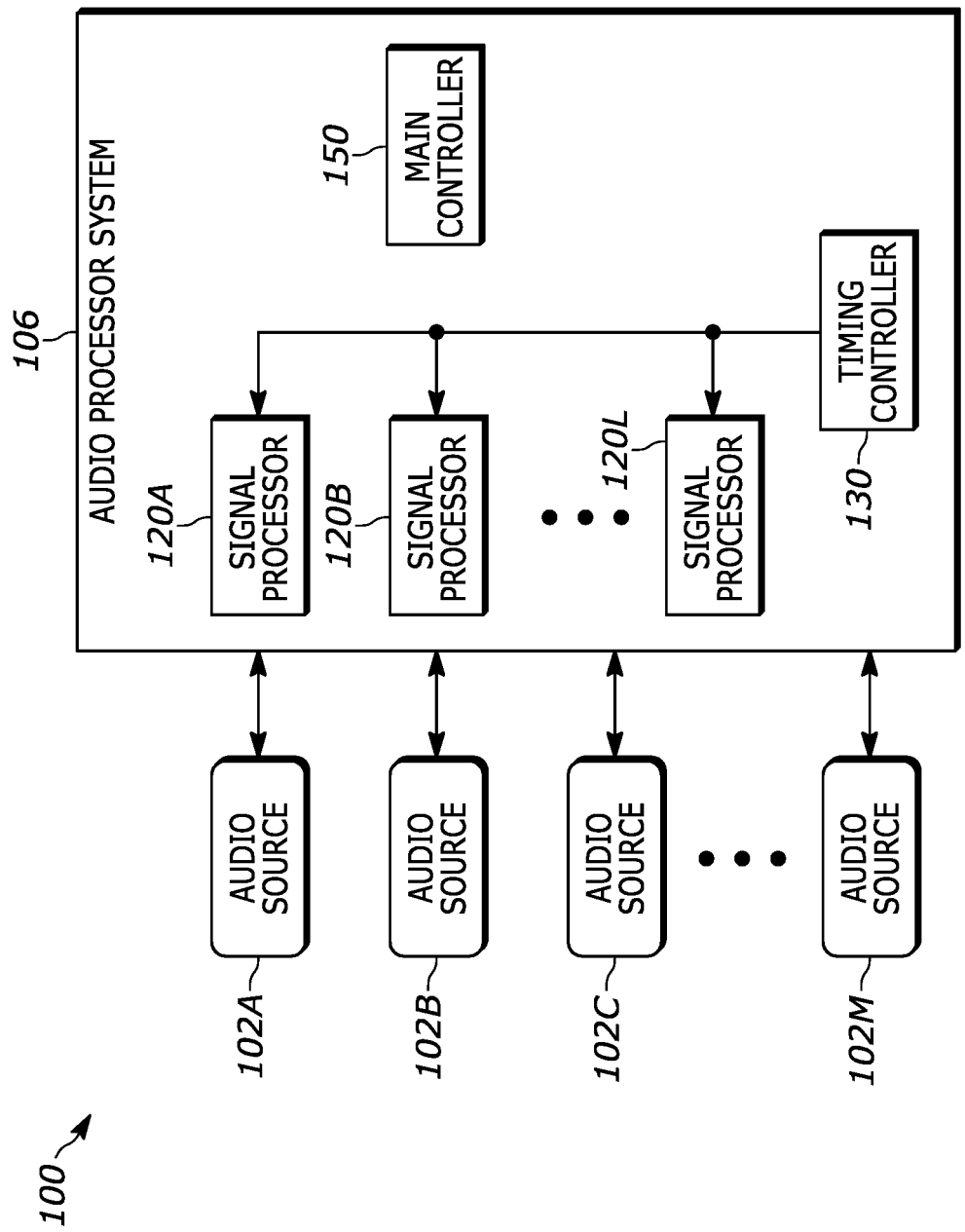
FIG. 1 is a block diagram of a system of a multi-core audio processor.

Referring now to FIG. 1, a block diagram of a system 100 including audio devices 102A, 102B ... 102M and a multi-core audio processor 106 is shown, according to an example embodiment. Each audio device 102 may sense acoustic vibrations (or sound) and generate audio data indicating the sensed acoustic vibrations. Examples of the audio devices 102 include microphones, for example, implemented by Micro-Electro-Mechanical Systems (MEMS) sensors. The audio devices 102 may be located at various locations on one or more electronic devices (e.g., a smart phone, a personal computer, a tablet computer, an Internet-of-Thing (IoT) device, etc.). The multi-core audio processor 106 is configured to receive streams of audio data from external audio devices 102A, 102B ... 102M, and perform various digital signal processing tasks on the received audio data via a plurality of digital signal processing cores contained therein.

In some embodiments, the multi-core audio processor 106 includes multiple signal processors 120A, 120B ... 120L and a timing controller 130. Although shown separately for illustration purposes, some or all of timing controller 130 may be commonly implemented with one or all of processors 120. Moreover, it should be apparent that multi-core audio processor 106 may include additional elements not shown in FIG. 1, such as memory, peripheral controllers, etc. However, further details regarding such additional elements are not necessary for an understanding of the present embodiments. Aspects of an example multi-core audio processor that can be adapted for use with the present embodiments are described in WO2019/067334, the contents of which are incorporated herein by reference in their entirety.

Timing controller 130 generates a timing signal or an initiation pulse that enables signal processors 120 to operate coherently. In one example, each signal processor 120 receives audio data from audio devices 102, and coherently converts a format of the received audio data according to one or more pulses from the timing controller 130. For example, each signal processor 120 converts or decimates audio data in a pulse density modulation (PDM) format into a pulse code modulation (PCM) format, in response to one or more pulses from the timing controller 130. In another example, each signal processor 120 converts or interpolates audio data in a PCM format into a PDM format, in response to one or more pulses from the timing controller 130.

Figure 2:
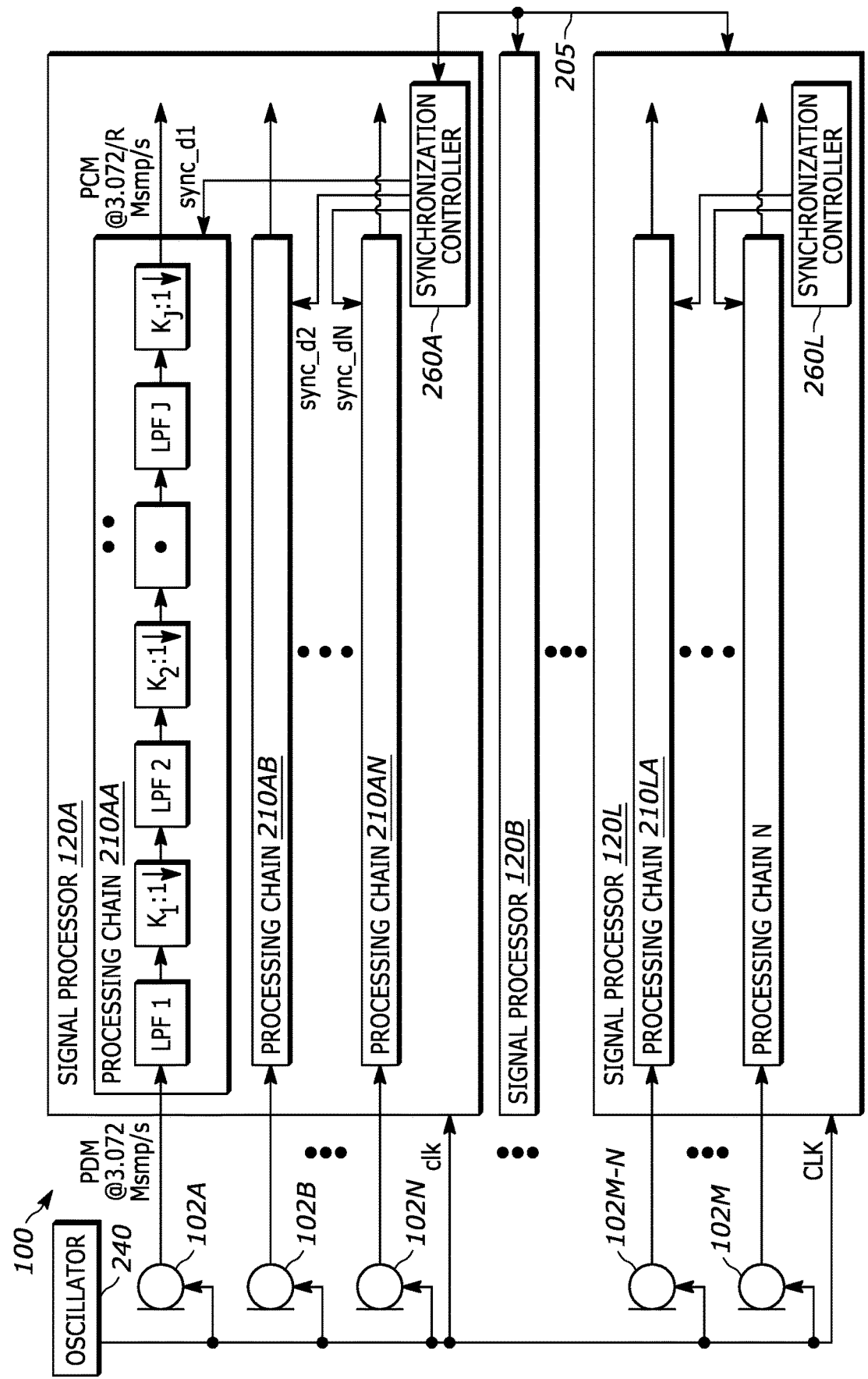
FIG. 2 is a block diagram of the multi-core audio processor including multiple signal processors shown in FIG. 1.

Referring to FIG. 2, illustrated is a more detailed block diagram of one example of system 100 shown in FIG. 1. In some embodiments, the audio devices 102A, 102B ... 102M are coupled to an oscillator 240. The oscillator 240 generates a clock signal CLK, for example, at 3.072 MHz corresponding to a PDM sampling rate. In response to the clock signal CLK from the oscillator 240, each audio device 102 senses sound (or acoustic vibration), and converts the acoustic vibration into a corresponding audio data, for example, in a PDM format. In some embodiments, each signal processor 120 is coupled to N number of audio devices 102. In this arrangement, each signal processor 120 is configured to perform signal processing on audio data from the N number of audio devices 102 in response to an initial pulse 205. For example, each signal processor 120 performs filtering and downsampling (or decimation) on the received audio data, in response to the initiation pulse 205 to convert the audio data in the PDM format into a PCM format.

In some embodiments, each signal processor 120X includes N number of inputs, N number of processing chains 210XA, 210XB . . . 210XN, and a synchronization controller 260X. Each input of the signal processor 120X is coupled to a corresponding audio device 102, for example, through a conductive material (e.g., metal route or trace). In one implementation, each processing chain 210 includes multiple filters (e.g., low pass filter) and downsamplers in an interconnected sequence to convert audio data in the PDM format into the PCM format such that a sampling rate of the converted audio data is lower than the sampling rate of the audio data before the conversion (e.g. 3.072/R Msmp/s, where R is the overall PDM to PCM decimation ratio). The filters may have the same or different cut-off frequencies. Also, downsampling ratios of the downsamplers may be the same or different. In one embodiment, different processing chains 210XA, 210XB . . . 210XN of the signal processor 120X receive corresponding synchronization pulses sync_d1, sync_d2 . . . sync_dN from the synchronization controller 260X, and perform signal processing on corresponding audio data in response to corresponding synchronization pulses sync_d1, sync_d2 . . . sync_dN. In one aspect, the synchronization controller 260 generates synchronization pulses sync_d1, sync_d2 . . . sync_dN having different phases in response to the initiation pulse 205. Accordingly, the processing chains 210XA, 210XB . . . 210XN can coherently convert audio data from a corresponding channel, in response to corresponding phases of the synchronization pulses sync_d1, sync_d2 . . . sync_dN. Processing chains 210X and synchronization controllers 260X can be implemented by hardware, firmware, software, and/or any combination thereof.

Figure 3:
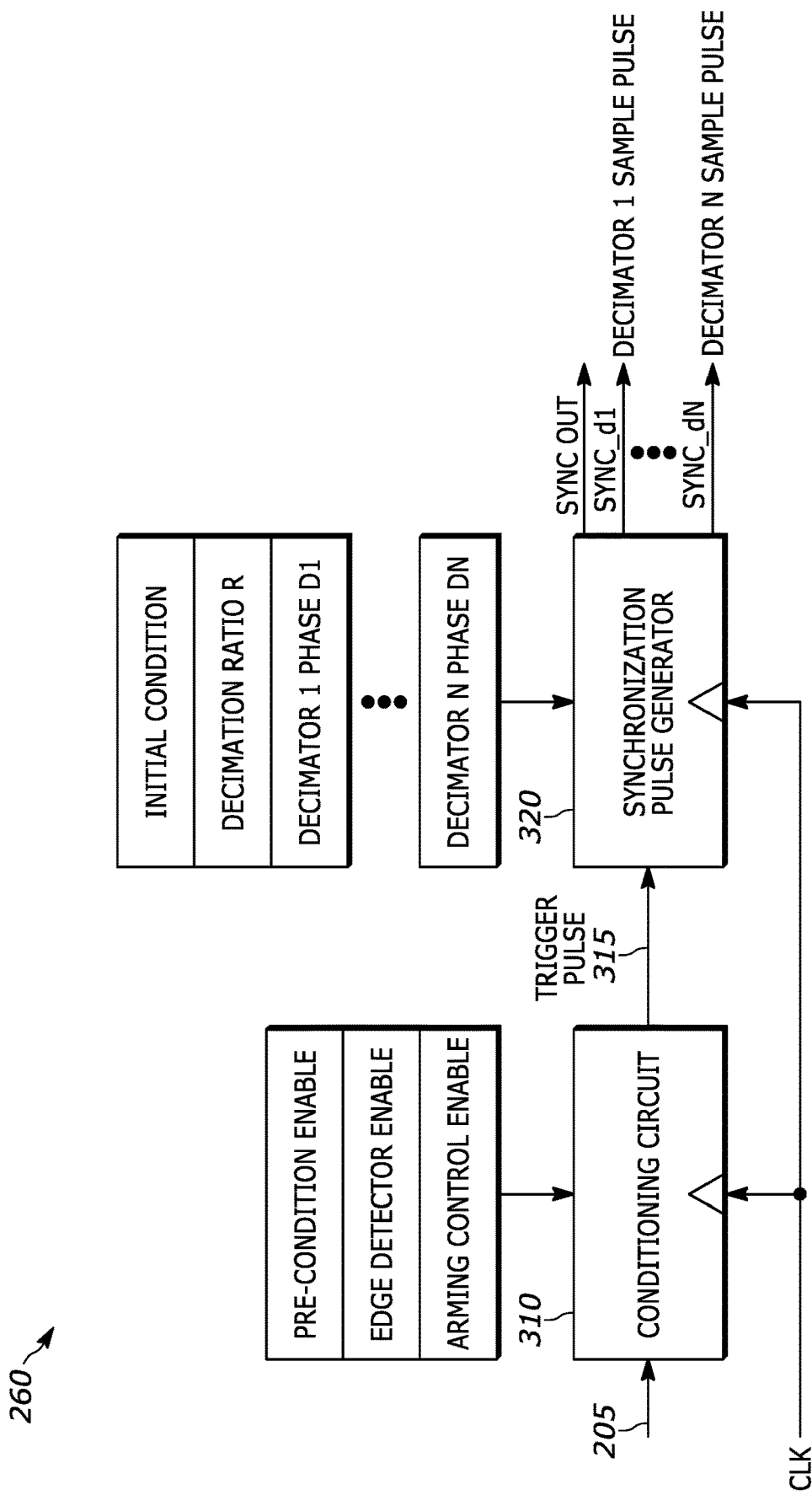
FIG. 3 is a schematic diagram of a synchronization controller of a signal processor shown in FIG. 2.

Referring to FIG. 3, illustrated is a schematic diagram of an example synchronization controller 260 of a signal processor 120 shown in FIG. 2. In some embodiments, the synchronization controller 260 includes a conditioning circuit 310 and a synchronization pulse generator 320. These components operate together to receive the initiation pulse 205, and generate synchronization pulses sync_d1, sync_d2 . . . sync_dN having corresponding phases. In some embodiments, the synchronization controller 260 includes more, fewer, or different components than shown in FIG. 3.

In one aspect, the conditioning circuit 310 receives the initiation pulse 205, a pre-condition enable, an edge detector enable, arming control enable signals, and the clock signal CLK, then generates a trigger pulse 315 synchronous to the clock signal CLK. The conditioning circuit 310 may receive the initiation pulse 205 from an external entity (e.g. a power-on reset pulse) or from a synchronization controller 260 in another processor 120 (e.g. a synchronization controller 260 in one processor 120 can be designated a "master" controller to the synchronization controller 260 in all of the other processors 120, and one of its synchronization pulses can be output to the other processors 120 as initiation pulse 205). Conditioning circuit 310 may receive the pre-condition enable, edge detector enable, arming control enable signals from registers which can be set by external or internal entities to multi-core processor 106, and receive the clock signal CLK from the oscillator 240. In one aspect, when the pre-condition enable, edge detector enable and arming control enable signals are in a high state (or logic '1') and the initiation pulse 205 is in the high state, the conditioning circuit 310 may detect a target edge (e.g., a rising edge) of the clock signal CLK and generate the trigger pulse 315 having a predetermined pulse width in response to detecting the target edge of the clock signal. If any of the pre-condition enable, edge detector enable, arming control enable signals is not in the high state, the conditioning circuit 310 may not generate the trigger pulse 315. Detailed implementation and operation of the conditioning circuit 310 are provided below with respect to FIGS. 4 and 6.

In one aspect, the synchronization pulse generator 320 receives the trigger pulse 315, and generates synchronization pulses sync_d1 . . . sync_dN. The synchronization pulse generator 320 may receive the trigger pulse from the conditioning circuit 310, receive the initial condition, the decimation ratio R, and decimator 1 phase D1 . . . decimator N phase DN values from registers which can be set by external or internal entities to multi-core processor 106, and receive the clock signal CLK from the oscillator 240. In one aspect, the synchronization pulse generator 320 generates the synchronization pulses sync out, sync_d1 . . . sync_dN synchronous to the clock signal CLK at phases determined by the initial condition, decimation ratio R, decimator 1 phase D1 . . . decimator N phase DN signals. For example, the synchronization pulse generator 320 divides the frequency of the clock signal CLK by the decimation ratio R, and starts counting a number of clock cycles starting from a value indicated by the initial condition. In response to the counted number matching a decimator X phase DX value, the synchronization pulse generator 320 may generate the synchronization pulse sync_dX. In response to the counted number reaching a ceiling value (or a maximum number), the synchronization pulse generator 320 may reset the counted number to a floor value (or a minimum number such as '0'). Accordingly, the synchronization pulse generator 320 allows phases of the synchronization pulses to be arbitrarily selected according to the initial condition, decimation ratio R and decimator 1 phase D1 . . . decimator N phase DN values. Detailed implementation and operation of the synchronization pulse generator 320 are provided below with respect to FIGS. 5 and 6.

Figure 4:
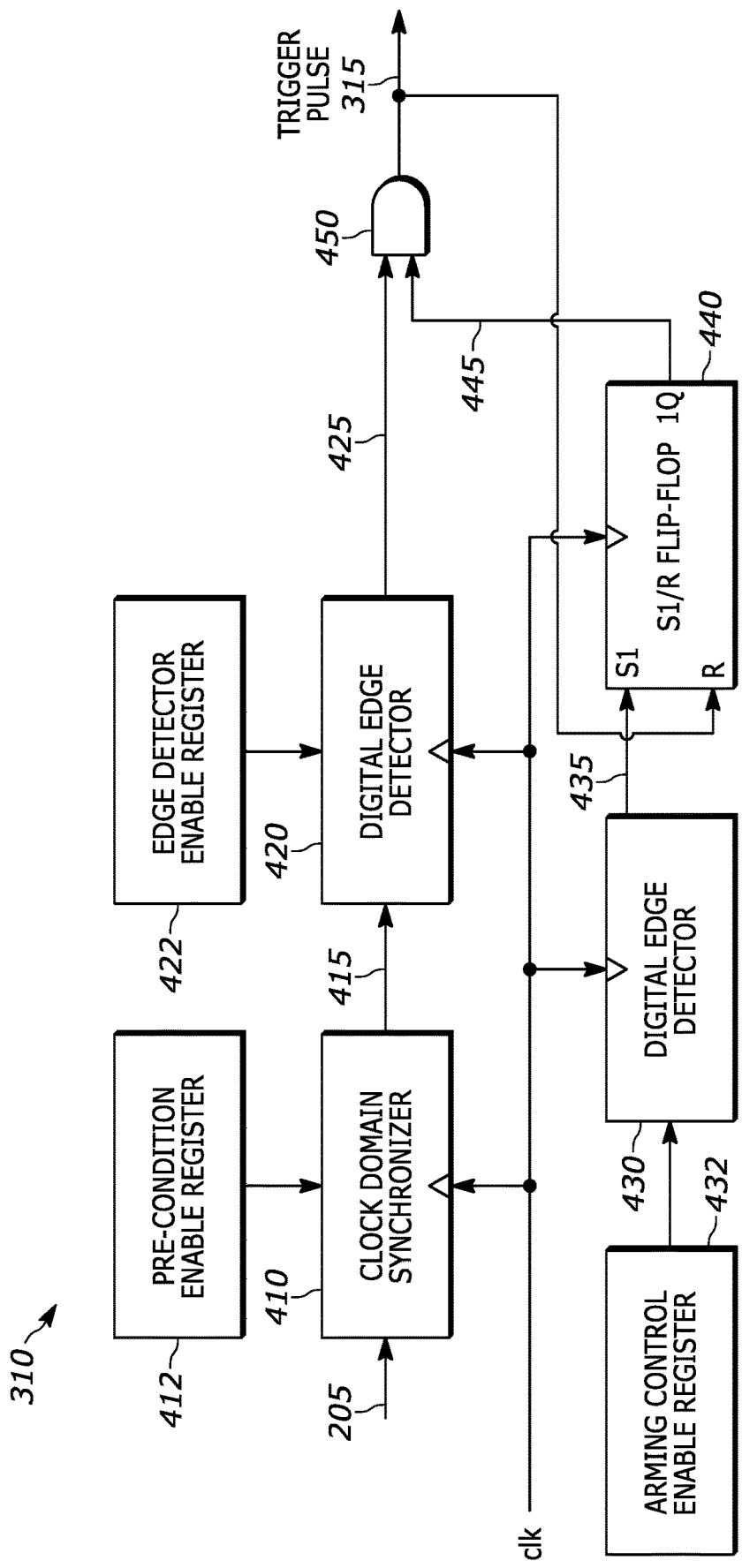
FIG. 4 is a schematic diagram of a conditioning circuit of the synchronization controller shown in FIG. 3.

Referring now to FIG. 4, illustrated is a schematic diagram of an example conditioning circuit 310 of the synchronization controller 260 shown in FIG. 3. In some embodiments, the conditioning circuit 310 includes a clock domain synchronizer 410, a digital edge detector 420, a digital edge detector 430, an SR flip flop 440, an AND gate 450, precondition enable register 412, edge detector enable register 422, and an arming control enable register 432. The pre-condition enable register 412 is a register to receive and store a pre-condition enable signal, the edge detector enable register 422 is a register to receive and store an edge detector enable signal, and the arming control enable register 432 is a register to receive and store an arming control enable signal. These components operate together to receive the initiation pulse 205 and generate the trigger pulse 315 synchronous to the clock signal CLK, according to the initiation pulse 205, the pre-condition enable, edge detector enable, arming control enable signals. In other embodiments, the conditioning circuit 310 includes more, fewer, or different components than shown in FIG. 4.

The clock domain synchronizer 410 is a circuit that synchronizes the initiation pulse 205 with the clock signal CLK according to the pre-condition enable signal stored by the pre-condition enable register 412. In one example, in response to a high state (or logic '1') of the pre-condition enable signal, the clock domain synchronizer 410 synchronizes or aligns an edge of the initiation pulse 205 with an edge of the clock signal CLK to output a synchronized pulse 415. In response to a low state (or logic '0') of the pre-condition enable signal, the clock domain synchronizer 410 may reset its output to a predetermined state (e.g., low state).

The digital edge detector 420 is a circuit that detects an edge of the clock signal CLK and generates a first edge detection signal 425 according to the edge detector enable signal stored by the edge detector enable register 422 and the synchronized pulse 415. In one aspect, in response to a high state (or logic '1') of the edge detector enable signal and when the synchronized pulse has a high state, the digital edge detector 420 may detect a target edge (e.g., falling edge, or rising edge) of the clock signal CLK, and generate the first edge detection signal 425 indicating the detected target edge. In response to a low state (or logic '0') of the edge detector enable signal, the digital edge detector 420 may not respond to the clock signal CLK or may reset its output to a predetermined state (e.g., low state).

The digital edge detector 430 is a circuit that detects an edge of the clock signal CLK and generates a second edge detection signal 435 according to the arming control enable signal stored by the arming control enable register 432. In one aspect, in response to a high state (or logic '1') of the arming control enable signal, the digital edge detector 430 may detect a target edge (e.g., falling edge, or rising edge) of the clock signal CLK, and generate the second edge detection signal 435 indicating the detected target edge. In response to a low state (or logic '0') of the arming control enable signal, the digital edge detector 430 may not respond to the clock signal CLK or may reset its output to a predetermined state (e.g., low state).

The SR flip flop 440 is a circuit that generates a control pulse 445 synchronous to the clock signal CLK, in response to the second edge detection signal 435 and the trigger pulse 315. In one configuration, the SR flip flop 440 includes an S input port coupled to an output port of the digital edge detector 430 to receive the second edge detection signal 435, an R input port coupled to an output port of the AND gate 450 to receive the trigger pulse 315, a Q output port coupled to an input port of the AND gate 450, and a clock port to receive the clock signal CLK. In this configuration, in response to the second edge detection signal 435 in a high state and the trigger pulse 315 in a low state, the SR flip flop 440 may generate the control pulse 445 in a high state synchronous to the clock signal CLK. In response to the second edge detection signal 435 and the trigger pulse 315 in a high state, the SR flip flop 440 may generate the control pulse 445 in a low state synchronous to the clock signal CLK.

The AND gate 450 is a circuit that performs AND logic operation on the first edge detection signal 425 and the control pulse 445 to generate the trigger pulse 315. In one configuration, the AND gate 450 includes a first input port coupled to an output port of the digital edge detector 420, a second input port coupled to the output port of the SR flip flop 440, and an output port coupled to the reset port of the SR flip flop 440. Thus, the AND gate 450 and the SR flip flop 440 form a feedback loop. In this configuration, the AND gate 450 may generate the trigger pulse 315 in the high state, in response to the first edge detection signal 425 and the control pulse 445 in the high state. The trigger pulse 315 in the high state then causes the SR flip flop 440 to reset the control pulse 445 to a low state in the subsequent edge (e.g., rising edge or falling edge) of the clock signal CLK. The reset control pulse 445 in the low state causes the AND gate 450 to reset the trigger pulse 315 to the low state. Accordingly, through the feedback operation between the AND gate 450 and the SR flip flop 440, the trigger pulse 315 having a pulse width aligned to edges of the clock signal CLK can be generated.

Figure 5:
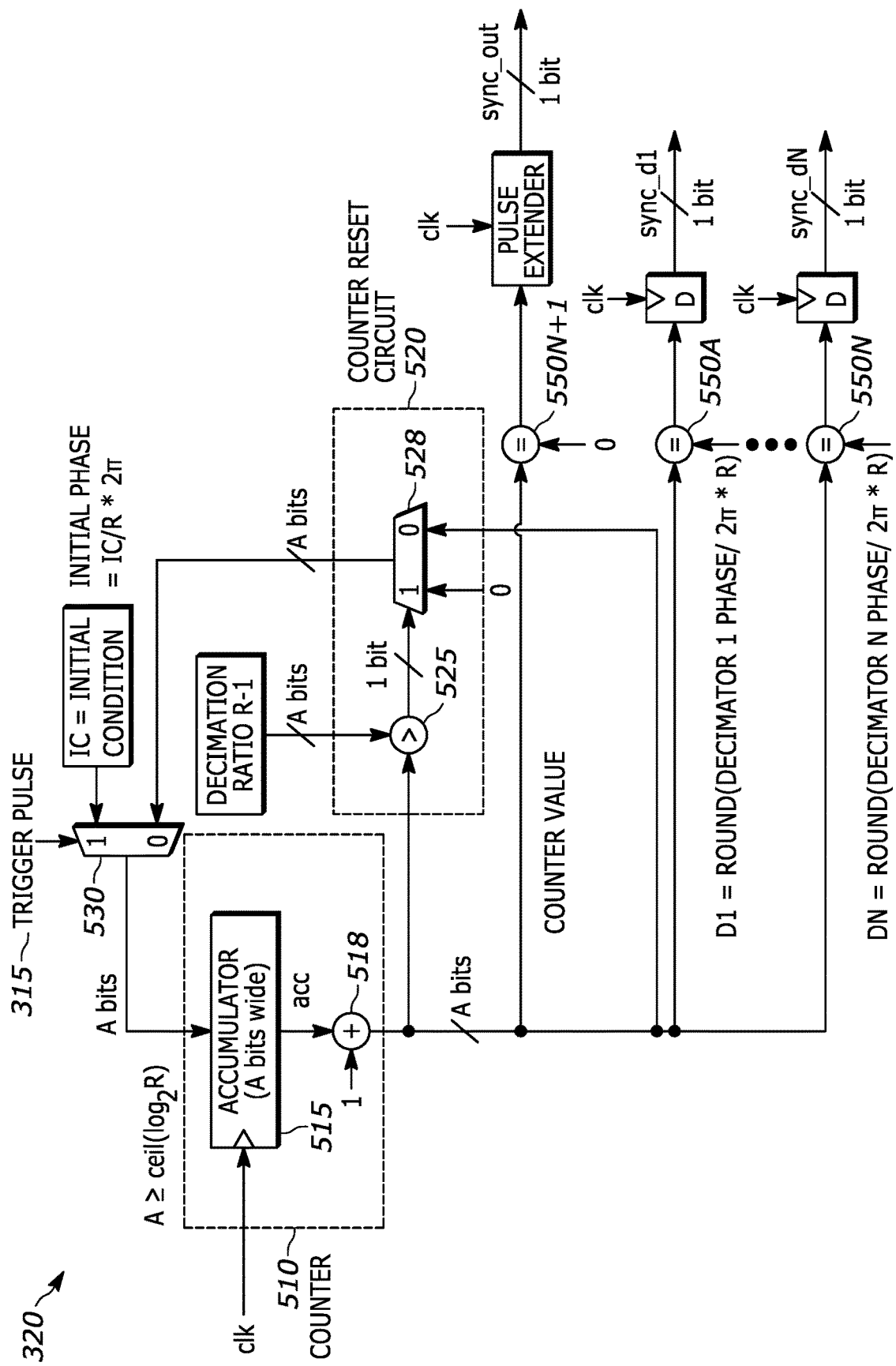
FIG. 5 is a schematic diagram of a synchronization pulse generator of the synchronization controller shown in FIG. 3.

Referring now to FIG. 5, illustrated is a schematic diagram of an example synchronization pulse generator 320 of the synchronization controller 260 shown in FIG. 3. In some embodiments, the synchronization pulse generator 320 includes an accumulator 515, an adder 518, a comparator 525, multiplexers 528, 530, comparators 550A . . . 550N+1. These components operate together to receive the trigger pulse 315, and generate synchronization pulses sync_d1 . . . sync_dN, sync_out having corresponding phases synchronous to the clock signal CLK. In other embodiments, the synchronization pulse generator 320 includes more, fewer, or different components than shown in FIG. 5.

In one aspect, the accumulator 515 and the adder 518 constitute a counter 510. In one configuration, an A-bit output port of the accumulator is coupled to an A-bit input port of the adder 518. In this configuration, the accumulator 515 receives and stores A-bits of data as a storage value acc from the multiplexer 530 synchronous to the clock signal CLK. The adder 518 adds a value '1' to the storage value acc to output A-bits of counter value. Thus, the counter 510 adds a value '1' to the output of the multiplexer 530 synchronous to the clock signal CLK. In some embodiments, the location of the accumulator 515 and the adder 518 are swapped, such that the adder 518 adds a value '1' to the A-bits of output from the multiplexer 530 and the accumulator 515 stores and outputs the incremented value as the counter value.

In one aspect, the comparator 525 and the multiplexer 528 constitute a counter reset circuit 520. In one configuration, the comparator 525 includes a first A-bit input port coupled to an A-bit output port of the counter 510, a second A-bit input port coupled to a register storing a ceiling value (or a maximum allowable counter value) corresponding to a decimation ratio R-1, and an output port coupled to a 1-bit control port of an A-bit multiplexer 528. The multiplexer 528 includes a first A-bit input port to receive a floor value (or a lowest allowable value of the counter value), a second A-bit input port coupled to the A-bit output port of the counter 510 to receive the counter value, and a 1-bit control port to receive the 1-bit output of the comparator 525. In this configuration, the comparator 525 compares the A-bit ceiling value and the A-bit counter value and generates an output indicating whether the counter value has reached or exceeded the ceiling value. If the counter value has reached or exceeded the ceiling value, the multiplexer 528 may output the A-bit floor value. If the counter value has not reached the ceiling value, the multiplexer 528 may output the A-bit counter value.

The multiplexer 530 is a circuit that receives the trigger pulse 315, and resets the counter value according to the trigger pulse 315. In one configuration, the multiplexer 530 includes a first A-bit input port to receive an initial condition, a second A-bit input port coupled to the A-bit output port of the multiplexer 528, a 1-bit control port to receive the trigger pulse 315, and an A-bit output port coupled to A-bit input port of the counter 510. In this configuration, in response to the trigger pulse 315 in a high state, the multiplexer 530 may output the initial condition. In response to the trigger pulse 315 in a low state, the multiplexer 530 may output the A-bit counter value.

In one aspect, through the feedback operation of the counter 510, the counter reset circuit 520, and the multiplexer 530, counter value is reset according to an initial condition synchronous to the clock pulse CLK, in response to the trigger pulse. The counter value is incremented by one for each clock cycle of the clock signal CLK, until the counter value reaches or exceeds the ceiling value. If the counter value reaches or exceeds the ceiling value, then the counter value may be reset to the floor value. The counter value then may be incremented by one for each clock cycle of the clock signal CLK.

The comparator 550X is a circuit that compares the A-bit counter value with a corresponding phase register value to generate a synchronization pulse sync_dX. In some embodiments, the comparator 550X includes a first A-bit input port coupled to the A-bit output port of the counter 510 to receive the counter value, a second A-bit input port coupled to a corresponding phase register to receive a corresponding phase register value, and a 1-bit output port. In this configuration, the comparator 550X compares the counter value with a corresponding phase register value. If the counter value is equal to the corresponding phase register value, the comparator 550X may generate its output, for example, in a high state. If the counter value is not equal to the corresponding phase register value, the comparator 550X may generate its output, for example, in a low state. In some embodiments, the output of the comparator 550X is timed according to the clock signal CLK by a flip flop, and the output of the flip flop is provided as a synchronization pulse sync_dX.

In one aspect, the comparators 550A-550N+1 compare the counter value with corresponding phase register values and generate the synchronization pulses sync_d1 . . . sync_dN, sync_out according to the comparison, such that synchronization pulses sync_d1 . . . sync_dN, sync_out are output at corresponding phases in a decimated clock cycle. In one example, a phase register value of the comparator 550N+1 is a value '0' and a phase register value of the comparator 550X is determined according to the following function: Round(Xth phase/2π*R), where R is a decimation ratio. Hence, the synchronization pulse sync_out may have a pulse width between when the counter value is reset to the floor value and when the counter value reaches the initial condition IC. Then, the synchronization pulses sync_d1 . . . sync_dN may be evenly distributed without any overlap within a remaining period (R/Fclk) of a decimated clock cycle, where Fclk is a frequency of the clock signal CLK.

Figure 6:
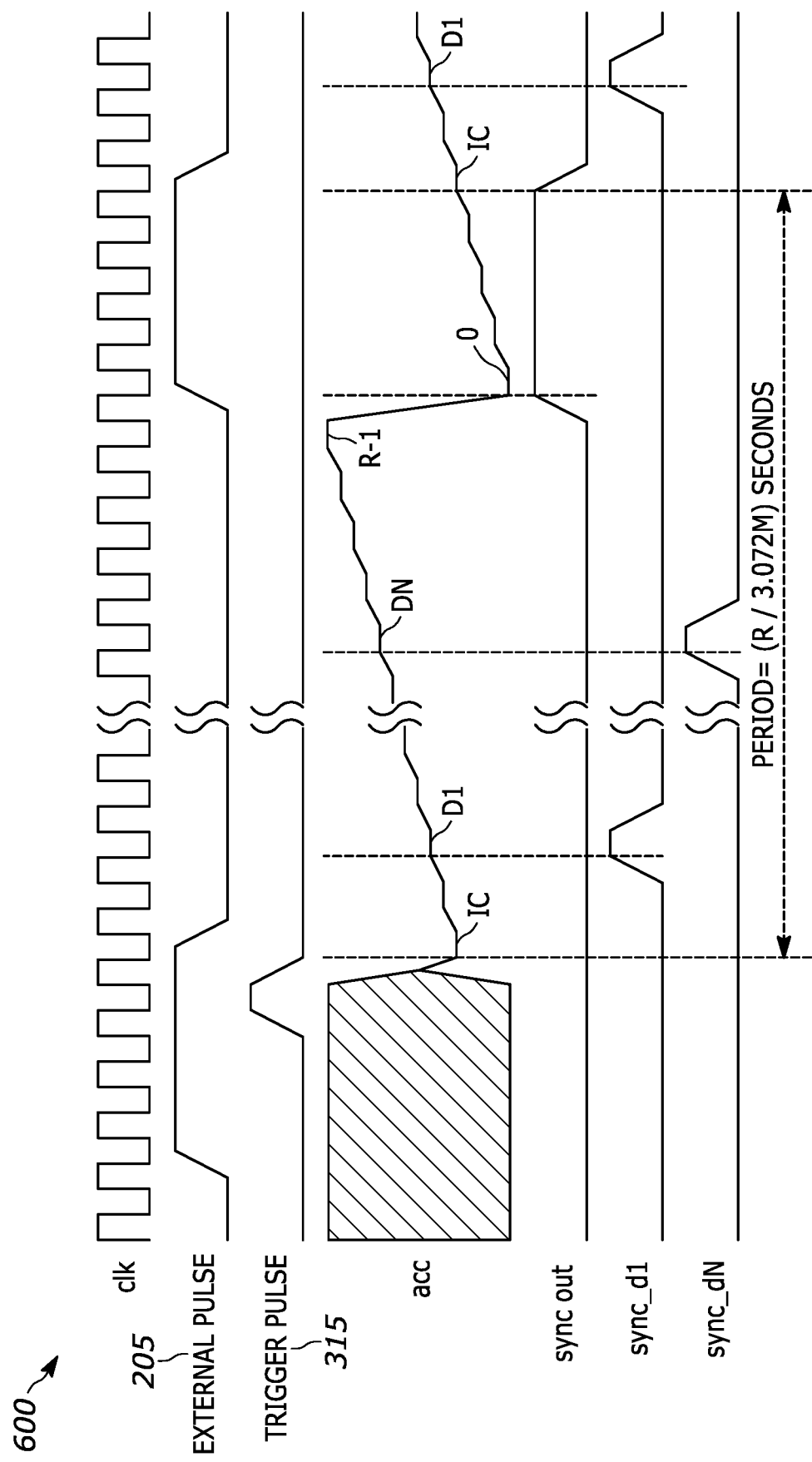
FIG. 6 is a timing diagram showing an operation of the synchronization controller shown in FIG. 2.

Referring now to FIG. 6, illustrated is a timing diagram 600 showing an operation of the synchronization controller 260 shown in FIG. 2. As described above with respect to FIGS. 3 and 4, the conditioning circuit 310 may generate the trigger pulse 315 synchronous to the clock signal CLK, in response to the initiation pulse 205. The trigger pulse 315 may have a predetermined pulse width aligned to edges of the clock signal CLK, because of the feedback operation of the SR flip flop 440 and the AND gate 450 of FIG. 4.

In response to the trigger pulse 315, the synchronization pulse generator 320 generates synchronization pulses sync_d1 . . . sync_dN, which can be applied to corresponding processing chains 210 of an audio signal processor. In one example, the trigger pulse 315 resets the counter value to an initial condition IC, and increments the counter value for each clock cycle of the clock signal CLK by one or a predetermined number. If the counter value is equal to a phase register value of a particular channel X, the synchronization pulse generator 320 generates the synchronization pulse sync_dX for that channel X. If the counter value reaches or exceeds a ceiling value, the synchronization pulse generator 320 resets the counter value to a floor value, and continues to increment the counter value for each clock cycle of the clock signal CLK. The synchronization pulse generator 320 may generate the synchronization pulse sync_out having a pulse width between when the counter value is reset to the floor value and when the counter value reaches the initial condition IC. After the counter value reaches the initial condition IC, the synchronization pulse generator 320 may generate, for a channel X, the synchronization pulse sync_dX, when the counter value reaches a corresponding phase register value.

Figure 7:
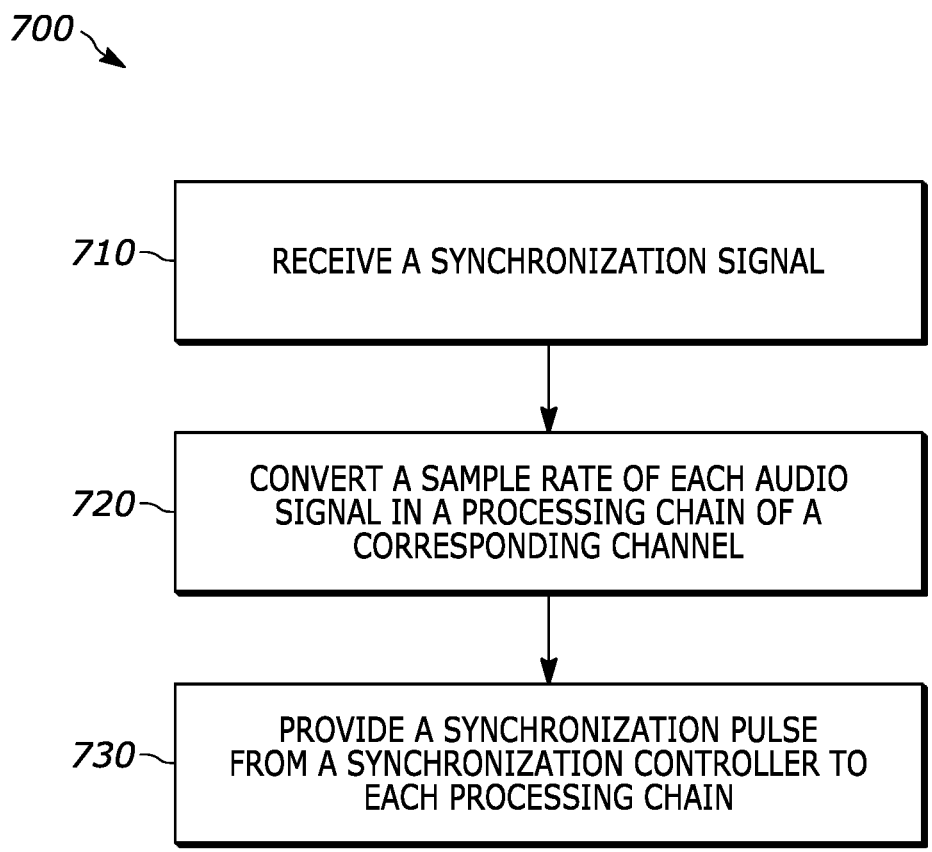
FIG. 7 is a flow diagram of a method of synchronizing audio signal processing on multiple channels.

Referring now to FIG. 7, illustrated is a flow diagram of a method 700 of synchronizing audio signal processing on multiple channels. In some embodiments, the method 700 is performed by the multi-core audio processor 106 of FIG. 1 or FIG. 2. In some embodiments, the method 700 is performed by other entities. In some embodiments, the method 700 includes more, fewer, or different operations than shown in FIG. 7.

In an operation 710, the multi-core audio processor 106 receives a plurality of audio signals or audio data from different audio sources (or audio devices 102). For example, the multi-core audio processor 106 receives audio data from different microphones in a PDM format with a sample rate at, for example, 3.072 MHz.

In an operation 720, the multi-core audio processor 106 converts a sample rate of each audio signal or audio data in a processing chain of a corresponding channel. In one approach, the multi-core audio processor 106 converts the sample rate of each audio signal or audio data by a decimation factor R, such that each processing chain outputs audio data with a lower sample rate. In one aspect, such conversion of the sample rate allows the format of the audio data to be converted from the PDM format to the PCM format.

In an operation 730, the multi-core audio processor 106 provides a synchronization pulse from a synchronization controller to each processing chain, where each synchronization pulse has a phase offset based on a counter output and a phase register value of the corresponding processing chain. In one aspect, phases of the converted audio signals are substantially coherent. The counter output may be generated based on a programmable initial condition applied to the counter in response to a trigger pulse, where the initial condition specifies a count at which the counter is initialized. The phases of the converted audio signals may be synchronized to within a single clock cycle of the converted sample rate (or a decimated sample rate). In one approach, the multi-core audio processor 106 phase synchronizes an arbitrarily selected external signal with a clock signal of the audio processor, and generates the trigger pulse in response to the arbitrarily selected external signal.

As used herein, the terms "approximately" generally mean plus or minus 10% of the stated value. For example, approximately 0.5 would include 0.45 and 0.55, approximately 10 would include 9 to 11, and approximately 1000 would include 900 to 1100.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An audio processor comprising:
    a plurality of audio channels;
    a plurality of processing chains respectively coupled to the plurality of audio channels, each of the processing chains being configured to convert audio data from a first sample rate to a second sample rate; and
    a synchronization controller configured to generate a plurality of synchronization pulses for the plurality of processing chains in response to a single trigger pulse and a clock signal,
    wherein the synchronization pulses each have a period corresponding to the second sample rate, and
    wherein the synchronization pulses cause the plurality of audio channels to all be synchronized to within a single clock cycle of the second sample rate.

2. The audio processor of claim 1, the synchronization controller including a counter configured to generate an output based on a programmable initial condition of the counter, the programmable initial condition specifying a count at which the counter is initialized, wherein the synchronization pulses are based on the counter output and a phase register value of corresponding processing chains.

3. The audio processor of claim 1, wherein the second sample rate is lower than the first sample rate by a decimation ratio and wherein each of the plurality of processing chains is configured to low pass filter and decimate the audio data of a corresponding audio channel using a corresponding one of the synchronization pulses.

4. The audio processor of claim 1, wherein the synchronization controller includes:
    a counter configured to generate an output based on a counted a number of clock cycles of the first sample rate; and
    a plurality of pulse generators coupled to the counter, each of the plurality of pulse generators configured to generate a corresponding one of the synchronization pulses based on the counted number of the clock cycles of the first sample rate.

5. The audio processor of claim 4, wherein each of the plurality of pulse generators is configured to generate the corresponding one of the synchronization pulses in response to the counted number being equal to a corresponding one of a plurality of predetermined numbers.

6. The audio processor of claim 4, wherein the synchronization controller includes:
    a multiplexer coupled to the counter, the multiplexer configured to set the counted number by the counter to an initial value in response to the trigger pulse.

7. The audio processor of claim 4, wherein the synchronization controller includes:
    a counter reset circuit coupled to the counter, the counter reset circuit configured to:
    compare the counted number against a ceiling value, and
    set the counted number by the counter to a floor value, in response to the counted number being equal to or larger than the ceiling value.

8. The audio processor of claim 7, wherein the ceiling value corresponds to the period.

9. The audio processor of claim 1, wherein the synchronization controller includes:
    a conditioning circuit configured to generate the trigger pulse in response to a reset pulse.

10. The audio processor of claim 9, wherein the conditioning circuit includes an arming control mechanism configured to prevent generation of the trigger pulse.

11. A system of audio processors, the system comprising:
    a plurality of processors, each processor including:
        an audio data input configured to receive audio data from multiple audio sources;
        a plurality of audio channels coupled to the audio data input, each audio channel including a corresponding processing chain configured to convert a sample rate of audio data from a corresponding audio source;

a synchronization pulse generator configured to generate a corresponding synchronization pulse for each of the plurality of processing chains in response to a trigger pulse, the synchronization pulse generator including a counter configured to generate an output having a phase based on a programmable initial condition of the counter, wherein the synchronization pulse for each processing chain is based on the counter output and a phase register value of the corresponding processing chain; and a conditioning circuit configured to generate the trigger pulse in response to an external synchronization signal applied to each of the plurality of processors.

12. The system of claim 11, wherein each of the plurality of processing chains is configured to low pass filter and decimate the audio data of a corresponding audio channel using a corresponding one of the synchronization pulses.

13. The system of claim 11, wherein the synchronization pulse generator of a master one of the audio processors is configured to generate the synchronization signal for the other of the audio processors.

14. The system of claim 13, wherein the synchronization pulse generator of the master one of the audio processors generates the synchronization signal in response to an external signal.

15. A method in an audio processor, the method comprising:
receiving audio signals from different audio sources;
converting a sample rate of each audio signal in a processing chain of a corresponding channel; and
providing a synchronization pulse from a synchronization controller to each processing chain, each synchronization pulse having a phase offset based on a counter output and a phase register value of the corresponding processing chain,
wherein phases of the converted audio signals are substantially coherent.

16. The method of claim 15 further comprising generating the counter output based on a programmable initial condition applied to the counter in response to a trigger pulse, the initial condition specifying a count at which the counter is initialized, wherein the phases of the converted audio signals are synchronized to within a single clock cycle of the converted sample rate.

17. The method of claim 16 further comprising:
phase synchronizing an external signal with a clock signal of the processor; and
generating the trigger pulse in response to the external signal.

18. An audio processor comprising:
an audio data input configured to receive audio data from multiple audio sources;
a plurality of audio channels coupled to the audio data input, each audio channel including a corresponding processing chain configured to convert a sample rate of audio data from a corresponding audio source;
a counter configured to generate an output based on a programmable initial condition applied to the counter in response to a trigger pulse, the initial condition specifying a count at which the counter is initialized; and
a pulse generator configured to generate synchronization pulses for processing chains based on the output of the counter,
wherein the synchronization pulses substantially phase align converted audio data of the processing chains.

19. The audio processor of claim 18, wherein the synchronization pulses phase align data output from the plurality of processing chains within a single clock cycle.

20. The audio processor of claim 18, wherein the pulse generator is configured to generate the synchronization pulse for each processing chain based on the output of the counter and a phase register value of the corresponding processing chain.

21. The audio processor of claim 18 further comprising a counter reset circuit and an initial condition register coupled to the counter by a multiplexer.

22. The audio processor of claim 18 further comprising a conditioning circuit configured to generate the trigger pulse in response to an internal reset signal or an external signal.

23. The audio processor of claim 22, wherein the conditioning circuit includes a clock domain synchronizer configured to phase synchronize the internal reset signal or the external signal with a clock signal of the audio processor.

24. The audio processor of claim 22, wherein the conditioning circuit includes a digital signal edge detector configured to mask all but a single pulse of the internal reset signal or the external signal, wherein the trigger pulse is a one-time pulse.

* * * * *